(12) United States Patent
Inagaki

(10) Patent No.: US 11,259,451 B2
(45) Date of Patent: Feb. 22, 2022

(54) PRODUCTION MANAGEMENT DEVICE

(71) Applicant: FUJI CORPORATION, Chiryu (JP)

(72) Inventor: Mitsutaka Inagaki, Anjo (JP)

(73) Assignee: FUJI CORPORATION, Chiryu (JP)

( * ) Notice: Subject to any disclaimer, the term of this patent is extended or adjusted under 35 U.S.C. 154(b) by 240 days.

(21) Appl. No.: 16/482,462

(22) PCT Filed: Feb. 2, 2017

(86) PCT No.: PCT/JP2017/003755
§ 371 (c)(1),
(2) Date: Jul. 31, 2019

(87) PCT Pub. No.: WO2018/142532
PCT Pub. Date: Aug. 9, 2018

(65) Prior Publication Data
US 2020/0008331 A1    Jan. 2, 2020

(51) Int. Cl.
*H05K 13/04* (2006.01)
*H05K 13/08* (2006.01)

(52) U.S. Cl.
CPC ......... *H05K 13/04* (2013.01); *H05K 13/0813* (2018.08); *H05K 13/0815* (2018.08)

(58) Field of Classification Search
CPC . H05K 13/04; H05K 13/0813; H05K 13/0815
See application file for complete search history.

(56) References Cited

U.S. PATENT DOCUMENTS

| 6,850,855 | B2 * | 2/2005 | Kawai | H05K 13/0815 702/84 |
| 7,114,249 | B2 * | 10/2006 | Murakami | G01N 21/956 29/833 |
| 7,356,176 | B2 * | 4/2008 | Fujii | G01N 21/8851 382/141 |

(Continued)

FOREIGN PATENT DOCUMENTS

| EP | 2 717 666 A1 | 4/2014 |
| EP | 2 902 861 A1 | 8/2015 |

(Continued)

OTHER PUBLICATIONS

International Search Report dated May 9, 2017 in PCT/JP2017/003755 filed on Feb. 2, 2017.

*Primary Examiner* — Carl J Arbes
(74) *Attorney, Agent, or Firm* — Oblon, McClelland, Maier & Neustadt, L.L.P.

(57) ABSTRACT

The production management device is applied to a production line for producing a board product. The production line includes a component mounter configured to mount a component on a circuit board under predetermined mounting conditions and an inspection device configured to inspect the mounting state of the component mounted on the circuit board, downstream from the component mounter. The production management device includes an information management section configured to store statistical information in which a mounting condition when a component, that is an inspection target, is mounted on a circuit board is linked to the results of multiple inspections by the inspection device.

11 Claims, 7 Drawing Sheets

(56) References Cited

U.S. PATENT DOCUMENTS

| | | | |
|---|---|---|---|
| 7,672,501 B2 * | 3/2010 | Minakata | G06T 7/0004 |
| | | | 382/141 |
| 8,131,060 B2 * | 3/2012 | Tateyama | H05K 13/083 |
| | | | 382/150 |
| 2008/0166039 A1 | 7/2008 | Tateyama et al. | |
| 2015/0334889 A1 | 11/2015 | Nishijima et al. | |

FOREIGN PATENT DOCUMENTS

| | | |
|---|---|---|
| EP | 2 922 380 A1 | 9/2015 |
| JP | 2008-28032 A | 2/2008 |
| JP | 2008-283081 A | 11/2008 |
| JP | 2012-227496 A | 11/2012 |
| JP | 2012-248815 A | 12/2012 |
| JP | 2014-116532 A | 6/2014 |

* cited by examiner

Fig.4  [Table 1] CONTROL PROGRAM

| MOUNTING COORDINATES | | MOUNTING ANGLE | REFERENCE CODE |
|---|---|---|---|
| X-axis COORDINATE | Y-axis COORDINATE | | |
| X1 | Y1 | θ1 | Ref1 |
| X2 | Y2 | θ2 | Ref2 |
| X3 | Y3 | θ3 | Ref3 |
| X4 | Y4 | θ4 | Ref4 |
| ⋮ | ⋮ | ⋮ | ⋮ |

[Table 2] PRODUCT TYPE - CORRESPONDING DATA

| PRODUCT TYPE | BOARD TYPE | CORRESPONDING DATA |
|---|---|---|
| U1 | B1 | BOM1 |
| U2 | B2 | BOM2 |
| U3 | B3 | BOM3 |
| ⋮ | ⋮ | ⋮ |

[Table 3] BOM1

| REFERENCE CODE | COMPONENT TYPE | EXTERNAL SHAPE DATA |
|---|---|---|
| Ref1 | Pa | Da |
| Ref2 | Pb | Db |
| Ref3 | Pc | Dc |
| Ref4 | Pb | Db |
| ⋮ | ⋮ | ⋮ |

[Table 4] BOM2

| REFERENCE CODE | COMPONENT TYPE | EXTERNAL SHAPE DATA |
|---|---|---|
| Ref1 | Pa | Da |
| Ref2 | Pb | Db |
| Ref3 | Pd | Dd |
| Ref4 | Pb | Db |
| ⋮ | ⋮ | ⋮ |

Fig.5

INSPECTION RESULTS

| BOARD ID | UNIT BOARD | REFERENCE CODE | DEVIATION AMOUNT | COMPONENT QUALITY | UNIT BOARD QUALITY |
|---|---|---|---|---|---|
| A-Fx511 | Fx511-01 | Ref1 | $\Delta X11Y11, \Delta\theta 11$ | OK | OK |
| | | Ref2 | $\Delta X21Y21, \Delta\theta 12$ | OK | |
| | | : | : | : | |
| | Fx511-02 | Ref1 | $\Delta X21Y21, \Delta\theta 21$ | OK | NG |
| | | Ref2 | $\Delta X22Y22, \Delta\theta 22$ | NG | |
| | | : | : | : | |
| | : | : | : | : | : |
| | Fx511-12 | : | : | : | : |
| A-Fx512 | Fx512-01 | : | : | : | : |
| | : | : | : | : | : |

Fig.6

[Table 1] STATISTICAL INFORMATION

| MOUNTING CONDITION | | NO. OF MOUNTING ERROR | MOUNTING ERROR OCCURRENCE RATE | CURRENT NUMBER OF CONSECUTIVE MOUNTINGS | MAXIMUM No. OF CONSECUTIVE MOUNTINGS | MARGIN DEGREE |
|---|---|---|---|---|---|---|
| PRODUCT TYPE | U1 | N11 | R11(%) | C11 | M11 | A11 |
| | U2 | N12 | R12(%) | C12 | M12 | A12 |
| | : | : | : | : | : | : |
| BOARD TYPE | B1 | N21 | R21(%) | C21 | M21 | A21 |
| | B2 | N22 | R22(%) | C22 | M22 | A22 |
| | : | : | : | : | : | : |
| REFERENCE CODE | Ref1 | N31 | R31(%) | C31 | M31 | A31 |
| | Ref2 | N32 | R32(%) | C32 | M32 | A32 |
| | : | : | : | : | : | : |
| EXTERNAL SHAPE DATA | Da | N41 | R41(%) | C41 | M41 | A41 |
| | Db | N42 | R42(%) | C42 | M42 | A42 |
| | : | : | : | : | : | : |

[Table 2] CHANGE EVENT AND DEFINED TIME (DEFINED No. OF MOUNTINGS)

| CHANGE EVENT | ID | DEFINED TIME/ DEFINED No. OF MOUNTINGS | ELAPSED TIME/No. OF EXECUTIONS | DETERMINATION TARGET |
|---|---|---|---|---|
| FEEDER EXCHANGE | F1 | C11 | L11 | ● |
| | F2 | C12 | L12 | — |
| | : | : | : | : |
| COMPONENT SUPPLIER CHANGE | P1 | C21 | L21 | ● |
| | P2 | C22 | L22 | ● |
| | : | : | : | : |
| EXTERNAL SHAPE DATA CHANGE | Da | C31 | L31 | — |
| | Db | C32 | L32 | — |
| | : | : | : | : |

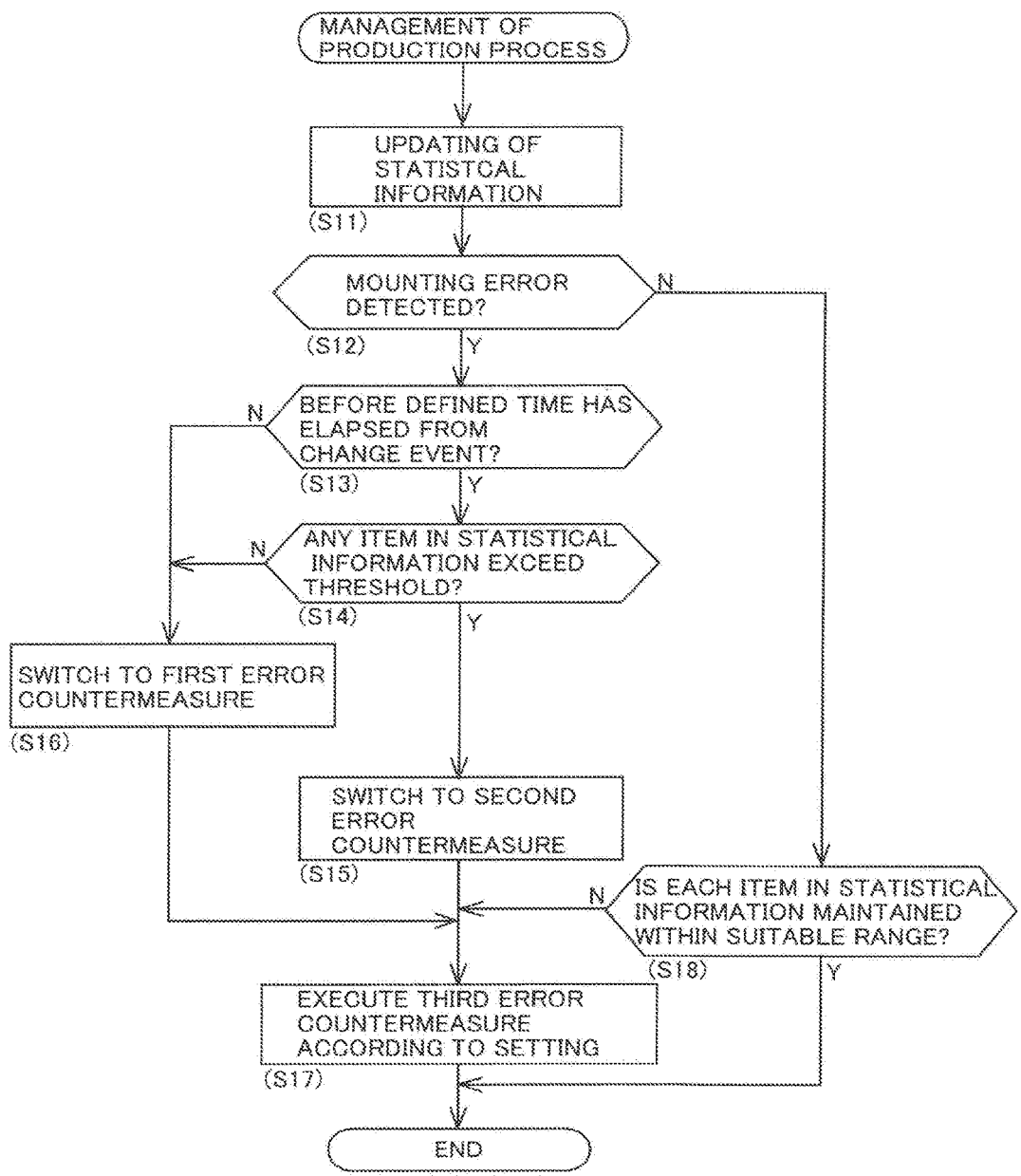

PRODUCTION MANAGEMENT DEVICE

TECHNICAL FIELD

The present application relates to a production management device.

BACKGROUND ART

The production management device is applied to a production line for producing a board product. As disclosed in Patent Literature 1, a production line is configured by, for example, installing a component mounter and an appearance inspection device in a conveyance direction of a circuit board. In such a production line, a mounting error in which a mounting state of a component mounted on a circuit board does not satisfy a certain standard may be detected by an appearance inspection. In such a case, the error is handled by skipping the mounting of the component in the component mounter that is located downstream in the production line from the appearance inspection. This minimizes disposal cost of a part of the board product that mounting errors affects (i.e., entire boards or a part of a multiple pattern board).

PATENT LITERATURE

Patent Literature 1: JP-A-2012-248815

BRIEF SUMMARY

Technical Problem

It is desirable to reduce costs of production in production lines by shortening the required time for production and suppressing the occurrence of mounting errors. It is therefore an object of the present specification to provide a production management device which manages inspection results from an inspection device as statistical information which can be used as a measure to reduce production costs.

Solution to Problem

The present specification discloses a production management device, being applied to a production line configured to produce a board product, wherein the production line comprises a component mounter configured to mount a component on a circuit board under predetermined mounting conditions, and an inspection device, being located downstream from the component mounter, which is configured to inspect the mounting state of the component mounted on the circuit board; wherein the production management device comprises an information management section configured to store statistical information in which mounting conditions, at a time of mounting the components as inspection targets on the circuit board, are linked to respective results of multiple inspections from the inspection device.

Advantageous Effect

With such a configuration, the inspection results from the inspection device are stored as statistical information with linking information of the corresponding mounting conditions. Such statistical information is information that can be useful in the analyses for elucidating trends in execution state of error countermeasure such as skipping on the downstream side of the production line and trends in mounting states when identifying the cause of a mounting error. For example, when a trend such as an execution state of error countermeasure is elucidated, it can be used as a basis for judging whether maintenance should be performed by suspending the production line. As a result, it is possible to reduce production costs by reducing the number of discarded circuit boards while suppressing a decrease in production efficiency.

BRIEF DESCRIPTION OF DRAWINGS

FIG. 4 shows mounting conditions including a control program.

FIG. 5 shows inspection results of an inspection device.

FIG. 6 shows statistical information linked to the mounting conditions from the inspection results.

FIG. 7 is a flow chart showing the management of the production process by the production management device.

DESCRIPTION OF EMBODIMENTS

1. Embodiment

1-1. Configuration of Production Line 1

Figure 1:
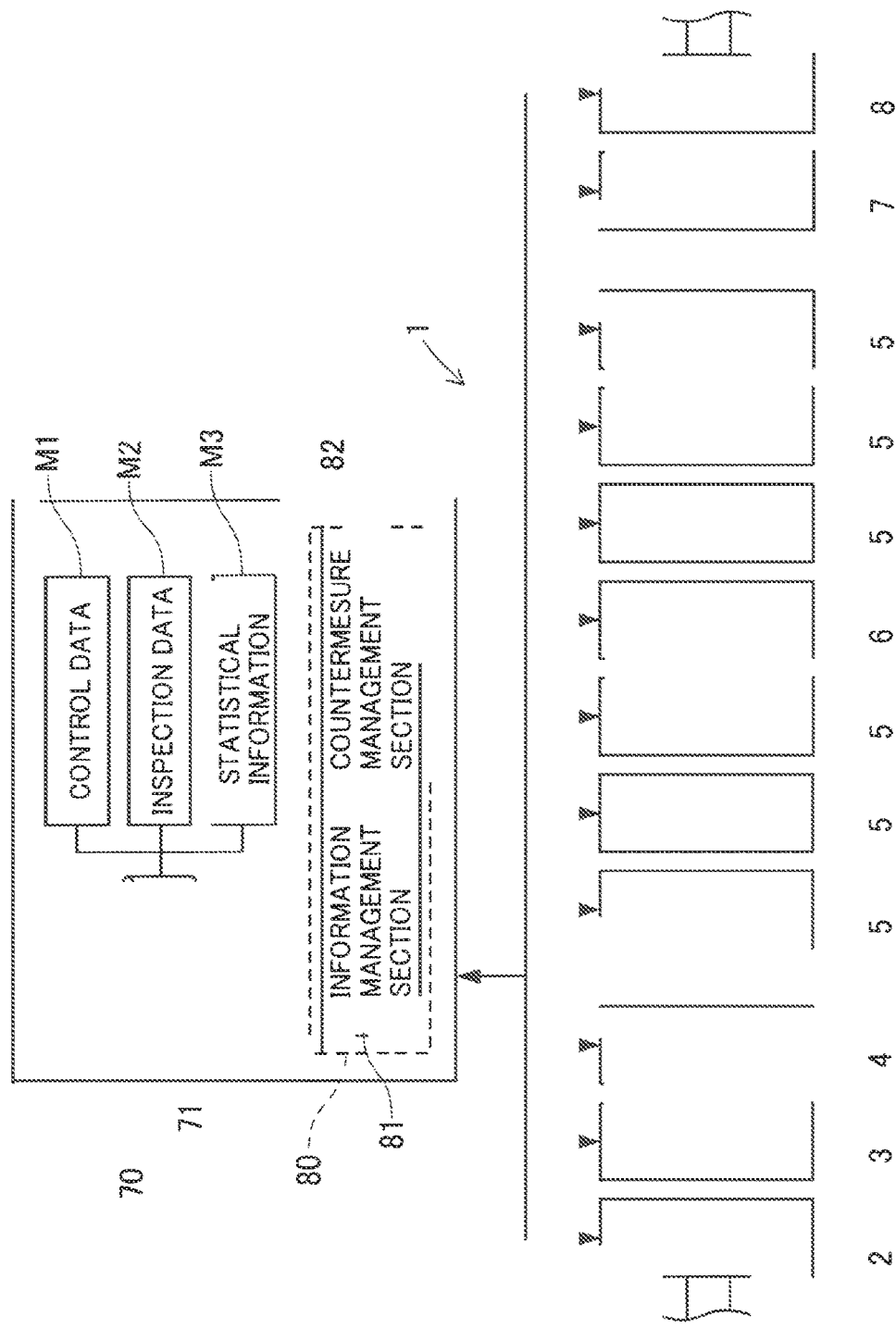
FIG. 1 is a plan view schematically illustrating a production line in an embodiment.

Production management devices are used in a production line to produce various board products. As shown in FIG. 1, production line 1 is configured by arranging multiple production devices in the conveyance direction (the left/right direction of FIG. 1 and FIG. 2) of circuit board 90. Hereinafter, the "circuit board" is simply referred to as the "board". The above-mentioned production devices include, in order from the upstream side of production line 1, printer 2, print inspection device 3, buffer device 4, multiple component mounters 5, appearance inspection device 6, reflow furnace 7, and functional tester 8.

In the production process of production line 1, board 90 is carried into printer 2 located at the beginning of production line 1. Board 90 is then conveyed downstream by the board conveyance device of each production device, for example, board conveyance device 10 of component mounter 5, shown in FIG. 2, and is conveyed out of functional tester 8 located at the end of production line 1. The production devices are communicably connected to each other and communicably connected to host computer (hereinafter referred to as "host PC") 70.

Printer 2 prints solder in the form of paste on the component mounting position of board 90 conveyed into printer 2. Printing inspection device 3 inspects the printing state of board 90 on which solder has been printed by printer 2. Buffer device 4 is configured to hold a defined number of boards 90 of production line 1. Buffer device 4 holds board 90 conveyed out from the upstream production device until the downstream production device is able to accept in board 90. Each of multiple component mounter 5 mounts a component on the solder of board 90 conveyed in from the upstream side of production line 1. The configuration of component mounter 5 will be described later.

Appearance inspection device 6 inspects the mounting state of an inspection target component based on the appearance of the component mounted on board 90 by component mounter 5 on the upstream side. The mounting state of the component includes the appropriateness of the component mounted on board 90 as well as the mounting position and orientation of the component. The inspection by appearance inspection device 6 includes an error determination for determining whether there is a mounting error in which the mounting state does not satisfy a certain criterion.

Further, the inspection by appearance inspection device 6 includes acquiring the amount of deviation of the mounting state of the component mounted on board 90 from the ideal state, including an ideal mounting position and orientation, as a level of the mounting state. As described above, when the appearance inspection is performed, appearance inspection device 6 transmits the level of the mounting state to host PC 70 as a result of the appearance inspection along with whether a mounting error has been detected.

Reflow furnace 7 heats board 90 conveyed from the upstream side of production line 1, melts the solder on board 90, and performs soldering. Functional tester 8 performs a function inspection of soldered circuit board 90. Specifically, functional tester 8 applies a predetermined input signal to board 90 and obtains an output signal corresponding to the input signal. Functional tester 8 then tests whether the function as the board product is normal based on the acquired output signal.

In this manner, production line 1 conveys board 90 to each production device in order and performs production processing including inspection processing to produce a board product. The configuration of production line 1 can be suitably added or changed in accordance with, for example, the type of board product to be produced. For example, production line 1 may be configured such that another production device is installed on the upstream side of printer 2, an intermediate position of the production line 1, or the downstream side of functional tester 8. Other production devices include, for example, a board supply device, a board flipping device, a shield mounting device, an adhesive application device, and an ultraviolet ray irradiation device.

Host PC 70 monitors the operation status of production line 1 and controls each production device. Host PC 70 has storage device 71 composed of a hard disk, flash memory, or the like. Storage device 71 stores various data for controlling multiple production devices constituting production line 1. Specifically, storage device 71 stores control data M1 such as a control program for operating each production device.

1-2. Component Mounter 5

Figure 2:
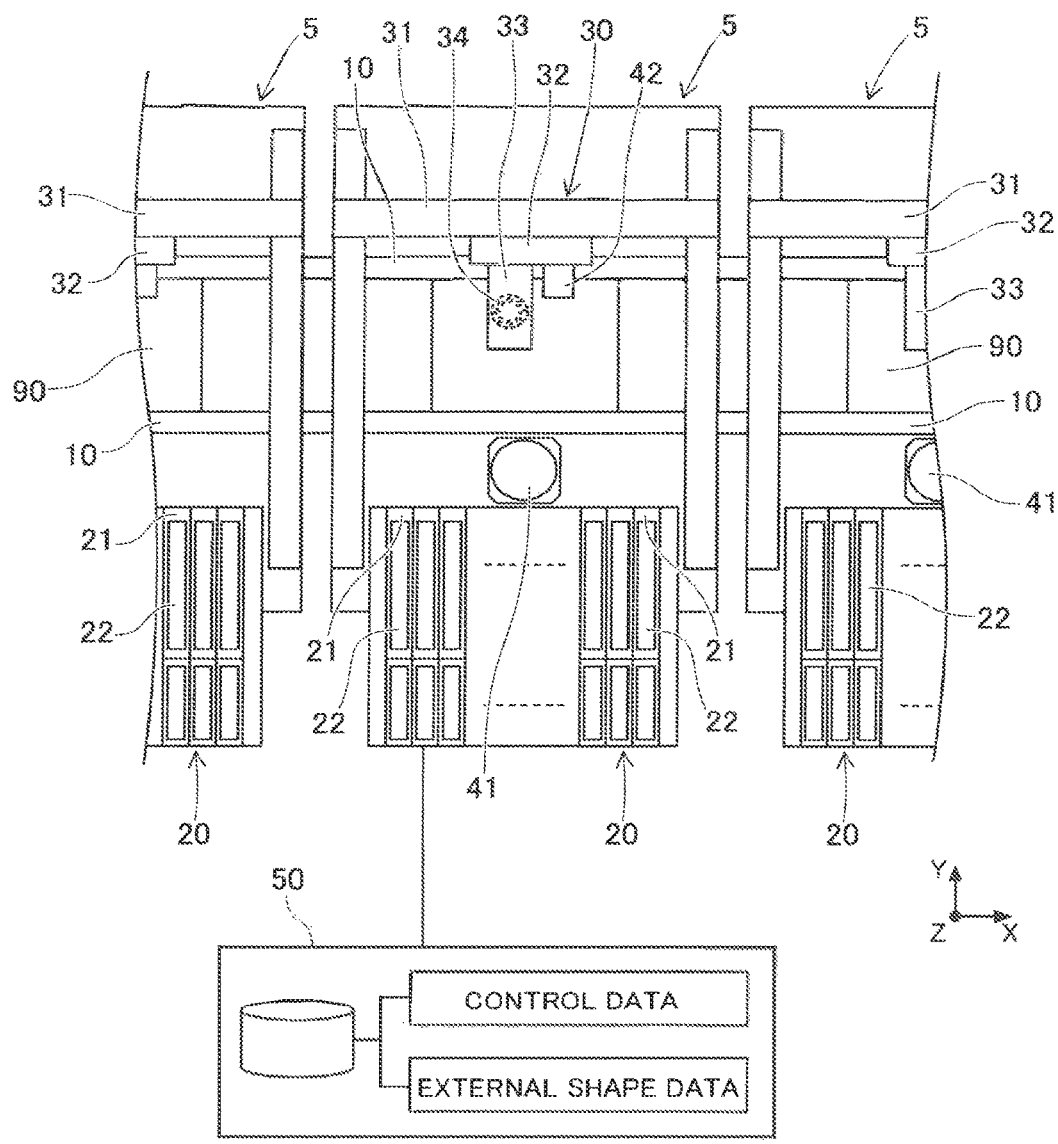
FIG. 2 is a schematic diagram illustrating a configuration of a component mounter in the production line of FIG. 1.

As shown in FIG. 2, component mounter 5 includes board conveyance device 10, component supply device 20, component transfer device 30, part camera 41, board camera 42, and control device 50. In the following description, the horizontal width direction (i.e., the left-right direction in FIG. 2) of component mounter 5 is defined as the X-axis direction, the horizontal depth direction (i.e., the up-down direction in FIG. 2) of component mounter 5 is defined as the Y-axis direction, and the vertical direction (i.e., the front-rear direction in FIG. 2) perpendicular to the X-axis and the Y-axis is defined as the Z-axis direction.

Board conveyance device 10 is configured by a belt conveyor or the like and conveys boards 90 sequentially in the conveyance direction (i.e., the X-axis direction in the present embodiment). Board conveyance device 10 conveys board 90 into component mounter 5 and positions board 90 at a predetermined position inside component mounter 5. After the mounting process of the component by component mounter 5 is completed, board conveyance device 10 conveys board 90 out of component mounter 5.

Component supply device 20 supplies components to be mounted on board 90. Component supply device 20 has multiple slots 21 arranged side by side in the X-axis direction. Feeder 22 is set in each of multiple slots 21 in an exchangeable manner. Feeder 22 feeds and moves a carrier tape containing a large number of components to feed the components to a feed position located on the distal end of feeder 22 in a manner which allows the components to be picked up.

Component transfer device 30 includes head driving device 31, moving body 32, and mounting head 33. Head driving device 31 is configured to move moving body 32 in the X-axis direction and the Y-axis direction by a linear movement mechanism. Mounting head 33 picks up components supplied by component supply device 20 and mounts the components at predetermined mounting positions of board 90. Mounting head 33 is fixed to moving body 32 by a clamp member (not shown).

Mounting head 33 has multiple suction nozzles 34 that are detachably provided. Mounting head 33 supports suction nozzles 34 so that each suction nozzle 34 is rotatable, about an R-axis parallel to the Z-axis, and able to move up and down. The lifting and lowering position and angle of suction nozzles 34 with respect to mounting head 33 and negative pressure supplied by suction nozzles 34 are controlled. When supplied with a negative pressure, suction nozzle 34 picks up a component supplied by feeder 22 of component supply device 20.

Part camera 41 and board camera 42 are digital imaging devices having imaging elements such as a CCD (Charge Coupled Device) and a CMOS (Complementary Metal Oxide Semiconductor). Part camera 41 and board camera 42 capture an image with a range that falls within the camera field of view based on a control signal from control device 50 communicably connected and transmit image data acquired by the imaging to control device 50.

Part camera 41 is fixed to the base of component mounter 5 so that the optical axis faces upward in the vertical direction (Z-axis direction). Part camera 41 is configured to capture an image of a component held by suction nozzle 34 of mounting head 33 from below component transfer device 30. Board camera 42 is provided on moving body 32 of component transfer device 30 so that the optical axis faces downward in the vertical direction (Z-axis direction). Board camera 42 is configured to capture an image of board 90.

Control device 50 mainly includes a CPU, various memory modules, and a control circuit. In the process of mounting a component on board 90, control device 50 receives information outputted from various sensors provided in component mounter 5 and results of recognition processes by image processing or the like. Control device 50 transmits a control signal to component transfer device 30 based on a control program, predetermined mounting conditions, and the like. Thus, the position and the rotation angle of suction nozzle 34 supported by mounting head 33 are controlled.

In the image processing described above, control device 50 recognizes the state of the component held by suction nozzle 34 based on image data acquired by imaging with part camera 41. More specifically, control device 50 matches component data, in the form of external shape data indicating the external shape of the component, with the component in the image data and recognizes the presence or absence of the component, the appropriateness, and the held position and orientation. Control device 50 then adjusts the position and the rotation angle of suction nozzle 34, in accordance with the recognized state of the component, and controls the component held by suction nozzle 34 such that the component is mounted on the mounting position of board 90 in a proper orientation.

Further, control device 50 may execute various types of image processing as necessary in addition to image processing for image data obtained by imaging the above-described component from below. For example, control device 50 may perform image processing on image data which is obtained by imaging a component from the side, or image data which is obtained by imaging a component mounted on board 90 from above, so as to inspect the good or bad of the component, or condition of the mounting state.

In such image processing, as described above, external shape data indicating the external shape of the component is used. More specifically, the external shape data includes data indicating the contour of a component, data indicating a distinguishing feature or the like in the outline of the component, and data configured by multiple seek lines arranged to correspond to the outline of the component. Further, the external shape data includes shape data as a criterion for judging the condition of the mounting state of multiple components regarded as a single component. Incidentally, even if components are of the same type, it is possible for the material, lead length, and the like to differ, changing the appearance in the image data. For this reason, different types of data are managed for each supplier, for example, in the above-mentioned external shape data.

1-3. Configuration of Board 90

Figure 3:
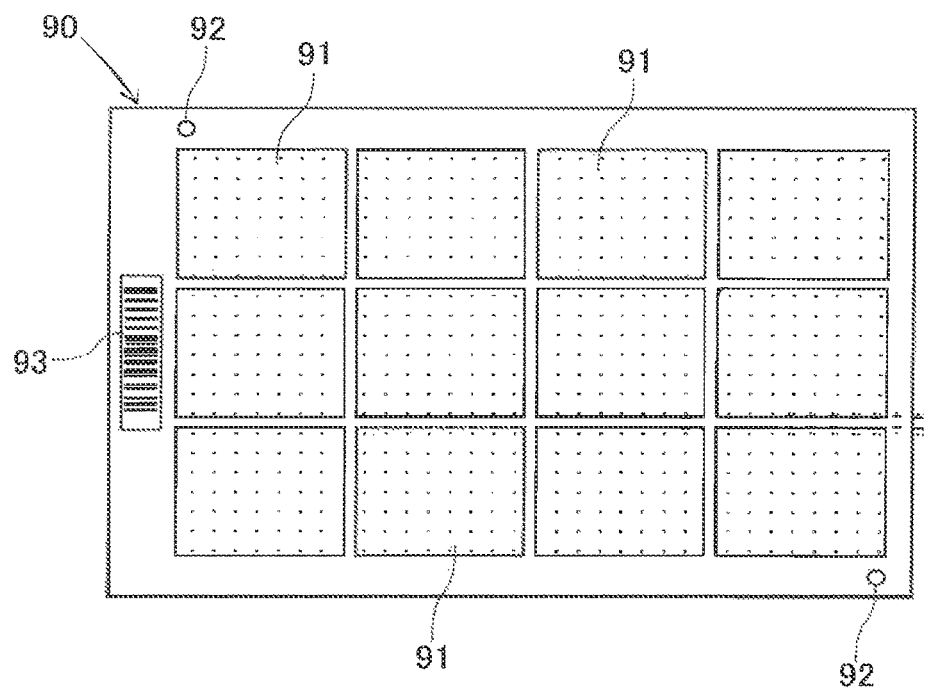
FIG. 3 is a top view illustrating a circuit board.

Here, as shown in FIG. 3, board 90 in the present embodiment is a multiple pattern board composed of multiple unit boards 91 (12 unit boards 91 in the present embodiment). At least a part of the multiple unit boards 91 in the multiple pattern board is of the same board type. Here, the "board type" in the multiple pattern board indicates the type of each of the multiple unit boards 91. The multiple pattern board is divided into individual board products after the mounting process is performed for each of the multiple unit boards 91.

When different types of mounting processes are performed on multiple unit boards 91 having the same board type, multiple types of board products are produced from a single board 90. That is, in the production of a multiple pattern board, multiple board products of multiple product types or the same product type are produced by considering each of the multiple unit boards 91 as a single board 90, and performing a predetermined type of mounting process for each of the multiple unit boards 91.

Two reference marks 92 and identification code 93 are provided on the upper face of board 90. Each of two reference marks 92 indicates a reference position of board 90. Control device 50 recognizes reference mark 92 based on the image data obtained by imaging reference mark 92 with board camera 42. Control device 50 then recognizes the reference position of board 90 positioned by board conveyance device 10 based on the recognized position of reference mark 92.

Identification code 93 shows an identification code that is unique to board 90. A bar code, a two-dimensional code, or the like can be used for identification code 93. In the present embodiment, identification code 93 uses a bar code configured by arranging multiple parallel bar lines having different line widths and spaces therebetween. Control device 50 reads the ID of board 90 based on the image data obtained by imaging identification code 93 with board camera 42.

Control device 50 then acquires identification information including the board type of board 90 based on board type data (not shown) in which the ID of board 90 and the board type are linked in advance. Here, since board 90 is a multiple pattern board, control device 50 acquires, as identification information, the number and positional relationship of multiple unit boards 91 constituting board 90, and the board type for each of the multiple unit boards 91.

1-4. Mounting Process by Component Mounter 5

Each of multiple types of mounting processes performed by component mounter 5 may be performed based on a common control program when the mounting process is performed on unit board 91 of the multiple pattern board. In the above-mentioned common control program, as shown in Table 1 of FIG. 4, the mounting angles of the electronic components and the reference codes are linked with the mounting coordinates for each electronic component.

The mounting coordinates (X-axis coordinates (X1, X2, X3, X4, ...) and Y-axis coordinates (Y1, Y2, Y3, Y4, ...)) are values indicating positions at which electronic components are mounted on multiple unit boards 91. The mounting angle ($\theta$-axis angle ($\theta1, \theta2, \theta3, \theta4, \ldots$)) of each electronic component is a value indicating the angle of the electronic component at the mounting coordinates. The reference code (Ref1, Ref2, Ref3, Ref4, ...) is a code for directing reference to the component type of the electronic component mounted at the mounting coordinates.

As shown in Tables 3 and 4 of FIG. 4, the multiple corresponding pieces of data (BOMs (Bills of Materials) 1, BOM2, ...) are data in which component types are linked to reference codes for each product type (U1, U2, ...). More specifically, in first corresponding data BOM1 used for manufacturing first product type U1, the component type (Pa, Pb, Pc, Pb, ...) of the electronic component and the type (Da, Db, Dc, Db, ...) of the external shape data indicating the external shape of the component are linked to the reference code (Ref1, Ref2, Ref3, Ref4, ...).

It should be noted that multiple product types (U1, U2, ...) and multiple corresponding data (BOM1, BOM2, ...) are linked as pairs by the product type-BOM data as shown in Table 2 of FIG. 4. With such a configuration, for example, when the production of a board product of first product type U1 is executed, first corresponding data BOM1 linked to first product type U1 is used, and electronic components of the component type (Pa) referenced by the first reference code (Ref1) are mounted at the first mounting angles ($\theta1$) at the first mounting coordinates (X1, Y1).

1-5. Overview of Production Management Device 80

When a production process is executed by production line 1 configured as described above, each process is executed in a production device such as printer 2 or component mounter 5, and board 90 is sequentially conveyed downstream. During the execution of such a production process, a mounting error may be detected by appearance inspection device 6. In such a case, for example, it is possible to suspend the production in production line 1 and attempt to repair board 90 related to the mounting error.

However, when the production is suspended, the entire production line 1 may be affected. Therefore, from the viewpoint of preventing a decrease in production efficiency, an error countermeasure (hereinafter referred to as "first error countermeasure") can be applied such that the production in production line 1 is continued, while the production is skipped to the extent that the mounting error has affected the board product downstream from appearance inspection device 6 in production line 1.

"The extent that the mounting error has affected the board product" mentioned above is whole or a part of the boards 90 which would become board products composed of electronic components and is judged as a bad mounting state based on the appearance inspection. Therefore, "the extent that the mounting error has affected the board product" corresponds to one of individual unit boards 91, in a case of board 90 being a multiple pattern board, while it corresponds to an entire board 90, in a case of the entire board 90 being a single board product.

With the above-described first error countermeasure, there is a disadvantage in that unit board 91, which has skipped some production, is discarded and the like after board 90 has been split. On the other hand, with the first error countermeasure, since production in production line 1 can be continued, it is possible to minimize decreases in production efficiency and reduce the disposal cost of unit board 91, which is discarded, by preventing the mounting of components to unit board 91 related to the mounting error.

Incidentally, the mounting error may occur accidentally due to a complex factor such as a change in the mounting environment or a variation in the shape of the component, or may occur due to an operational factor such as a malfunction of mounting head 33 or an error in the type of component being supplied. When a mounting error occurs due to an operational factor, the likelihood of a similar mounting error occurring thereafter increases. However, while the first error countermeasure is executed in production line 1, the production is continued while the mounting error occurs.

The operator may become aware that maintenance is necessary to eliminate operational factors as a result of, for example, an increase in the number of boards 90 or unit boards 91 that are discarded or require repairing. However, when the increase in the number of discarded boards 90 and the like is not remarkable, it is not easy to properly determine whether to continue the production of production line 1 with the first error countermeasure or to suspend the production of production line 1 and perform maintenance.

Therefore, production management device 80 is applied to production line 1, which is configured to produce a board product, and manages the production process in production line 1 in order to reduce the production cost in production line 1 by, for example, providing material for making the above-mentioned determination. In the present embodiment, as shown in FIG. 1, a mode in which production management device 80 is incorporated in host PC 70 will be demonstrated.

1-6. Detailed Configuration of Production Management Device 80

As shown in FIG. 1, production management device 80 includes information management section 81 and countermeasure management section 82.

Information management section 81 stores statistical information M3 (see Table 1 of FIG. 6) in which mounting conditions when components that are inspection targets are mounted on board 90, are linked to the results of multiple inspections from appearance inspection device 6.

Here, component mounter 5 constituting production line 1 mounts the component to board 90 under predetermined mounting conditions. As shown in the tables of FIG. 4, the mounting conditions include the type of board product (product type), the type of board 90 (board type), the type of component (component type), the mounting position of the component on board 90, and the type of external shape data indicating the external shape of a component, which is used as a criterion for judging the appropriateness of a component. The mounting position and the external shape data included in the mounting condition are stored in storage device 71 as control data M1, which is used for controlling component mounting (see FIG. 1).

Incidentally, "mounting conditions when components are mounted" mentioned above refers to the mounting conditions applied when components that are inspection targets are mounted, and not the mounting conditions applied to component mounter 5 at the time of inspection, because the appearance inspection is executed as a post-process downstream from component mounter 5. The mounting condition is recorded in control data M1 and linked to the ID of the board, for example.

Further, appearance inspection device 6 performs error determination and acquisition of the level of the mounting state during the appearance inspection. As a result, as shown in FIG. 5, the inspection result from appearance inspection device 6 indicates the mounting position of the component, the deviation amount in the XY-directions, the deviation amount around the θ-axis parallel to the Z-axis, and the condition of the mounting state of each component, and such a result is indicated for each unit board 91 of the board 90 that is an inspection target. The inspection results are accumulated each time an appearance inspection is performed and are stored in storage device 71 as inspection data M2 (see FIG. 1).

Statistical information M3 is information in which at least one of multiple mounting conditions is linked to an inspection result from appearance inspection device 6. In the present embodiment, as shown in Table 1 of FIG. 6, statistical information M3 is configured such that each mounting condition (see each table of FIG. 4) exemplified as described above is linked with the inspection result (see FIG. 5). More specifically, statistical information M3 shows, for example, the number of times the mounting condition of a component with respect to the mounting position (Ref1) is determined to be defective in multiple inspections as the number of mounting errors (N31).

Further, in the present embodiment, information management section 81 stores, as statistical information M3, the number of consecutive mounting errors and the mounting error occurrence rate in the error determination result that are linked to the same mounting condition. The number of consecutive mounting errors is, for example, the number of consecutive mounting errors determined to be defective in mounting at the same mounting position (Ref1), and may be managed by dividing into a current number of consecutive mounting errors (C31) and a maximum number of consecutive mounting errors including past mounting errors (M31).

The mounting error occurrence rate is a value indicating the occurrence frequency of the mounting error when the component is mounted under a certain mounting condition and is calculated, for example, as a ratio (R31) of the number of detected mounting errors to the total number of mounted components at the mounting position (Ref1). The mounting error occurrence rate may be the ratio of the number of detected mounting errors to the defined number of mountings for the latest defined number of mountings, or both occurrence rates may be included in statistical information M3. Further, based on the level of the mounting state, information management section 81 indicates in statistical information M3 as a margin degree (e.g., A31) how much of a margin there is from a threshold which is a criterion of quality of the mounting state of the component, which is an inspection target (in the case of a defect, the margin degree is lower than the threshold value).

Information management section 81 receives various data and updates statistical information M3 every time the production process progresses and components are mounted and every time an inspection by appearance inspection device 6 is executed. Such statistical information M3 is useful information that can be used for an analysis for understanding the execution status of an error countermeasure such as skipping on the downstream side of production line 1 and the trend in the mounting state when identifying the cause of a mounting error.

More specifically, when the mounting condition is, for example, the mounting position (Ref1) of the component, it is possible to obtain trends in the mounting state or the like by extracting the results of inspections relating to the mounting state of the component mounted at the same mounting position. For example, in the case where the number of times of occurrence of mounting errors relating to mounting of components at the same mounting position tends to increase, or in the case where the occurrence rate of mounting errors is high, it is presumed that there is a cause of the mounting errors in the control program and the external shape data relating to the mounting position.

Further, when multiple mounting conditions are linked with the inspection result as in the present embodiment, it is possible to perform a multifaceted analysis based on statistical information M3. As a result, when a mounting error occurs continually for a defined number of times, or the rate of occurrence of the mounting error reaches a defined value, it is possible to determine whether the cause of the mounting error is in a specific product type, a specific board type, a specific mounting position, and the like, thereby enabling improvement of the accuracy of specifying the cause of mounting errors in statistical information M3.

Additionally, the margin from statistical information M3 can be used to analyze whether the accuracy of the mounting process by component mounter 5 is properly maintained or is deteriorating. As a result, even if it is determined that the mounting state is good, for example, the reduced margin serves to alert users that the time for which maintenance is necessary is nearing. Thus, by executing adequate maintenance, it is possible to prevent the occurrence of mounting errors and maintain production efficiency.

Countermeasure management section 82 switches between multiple types of error countermeasures in production line 1 to handle the mounting error based on statistical information M3 or executes a combination of multiple types of error countermeasures. As described above, in the conventional configuration, when a mounting error is detected, a predetermined error countermeasure (e.g., skipping of production) is executed downstream. On the other hand, if countermeasure management section 82 switches between the multiple types of error countermeasures, a decrease in production efficiency can be prevented and an operator or the like can recognize the necessity of maintenance at an early stage.

In the present embodiment, the multiple types of error countermeasures include the second error countermeasure and the third error countermeasure in addition to the first error countermeasure. The first error countermeasure skips the processing on the downstream side of production line 1 for some or all boards 90 for which mounting errors have been detected without suspending production line 1. As a result, the board product (in the case of the entire board 90 or a portion of unit boards 91 in the case of the multiple pattern board) becomes a target of discarding or the like to the extent that the mounting error has affected, however, without suspending production line 1, a certain amount of production is ensured.

The second error countermeasure makes it possible to suspend the production in production line 1 and perform maintenance on component mounter 5. This allows the operator to become aware of the need for maintenance and perform maintenance to eliminate the cause of the mounting error. In this instance, the operator can use statistical information M3 as a basis for investigating the cause of the mounting error. As a result, even if production line 1 is suspended for the time required to perform maintenance, an increase in the cycle time and an increase in the number of discarded boards can be prevented, thereby reducing production costs.

In the third error countermeasure, a notification is sent out to the effect that maintenance of component mounter 5 is necessary. Specifically, for example, the operator is notified that the occurrence rate of the mounting error is increasing. As a result, the operator performs maintenance (e.g., setting an appropriate feeder 22) to the extent in which it is not necessary to suspend production line 1 or performs maintenance by suspending production line 1 at an appropriate timing as necessary. As a result, the operator can suitably perform maintenance taking into consideration the amount of progress made according to a production plan in production line 1.

In the present embodiment, countermeasure management section 82 switches and executes the first to third error countermeasures. Further, when the first error countermeasure and the second error countermeasure are executed, countermeasure management section 82 causes the operator or the administrator to execute the third error countermeasure in combination with the first error countermeasure and the second error countermeasure in accordance with the setting as to whether the third error countermeasure is also executed.

Here, in the case where the mounting error does not occur accidentally but occurs due to an operational factor, it is assumed that there is an error in setting or operation of a change event in component mounter 5. Therefore, when a mounting error is detected before a defined time has elapsed from a change event in component mounter 5 including a change in the mounting condition, countermeasure management section 82 switches between multiple types of error countermeasures or combines multiple types of error countermeasures in production line 1 based on a threshold value set in advance according to the mounting condition and statistical information M3.

The above-mentioned change event in component mounter 5 can be suitably set by an operator or an administrator as long as component mounter 5 can detect the before and after of the change. In the present embodiment, the change event includes exchanging an exchangeable element constituting component mounter 5, as shown in Table 2 of FIG. 6. The "exchangeable element" described above may include feeder 22, mounting head 33, suction nozzle 34, a nozzle tool that holds suction nozzle 34 and is provided in mounting head 33 and the like in an exchangeable manner. These exchangeable elements may be automatically exchanged by component mounter 5 or an external device, in addition to being exchanged by the work of an operator.

Further, in the present embodiment, the change event includes a change in control data M1 used for controlling the mounting of the component. Control data M1 includes a control program indicating the mounting position of the component on board 90 and external shape data indicating the external shape of the component used as a reference for judging the appropriateness of a component. Since component mounter 5 executes the mounting process based on the control program, if there is a problem in the operation instruction including the mounting position and the mounting angle of the control program, a mounting error due to a change event such as a change of the control program may occur.

Further, the external shape data may be managed separately for each component supplier even if the component type is the same. If the setting of the external shape data used for the mounting process is incomplete, a mounting error may occur due to a change event such as a change in the external shape data. Therefore, countermeasure management section 82 aims to accelerate handling of the mounting error caused by the change event by monitoring the mounting state of the component in the period before the defined time elapses from the above-described change event (i.e., exchange of the exchangeable element or change of control data M1).

The "defined time" may be the time counted by the timer from the change event, or the time until the item related to the change event is operated a defined number of times. That is, if the change event is an exchange of an exchangeable element, the defined time is the time from exchanging the exchangeable element to the time the exchangeable element is used a defined number of times. More specifically, when suction nozzle 34 is automatically exchanged as an exchangeable element, the time it takes until mounting using suction nozzle 34 is executed a defined number of times is defined as a defined time.

When the change event is a change in the product type or the board type, the defined time may be the time until the mounting process is performed on a defined number of boards 90. When the change event is a change in the type of component, the defined time may be the time until a defined number of components are used in the mounting process. The defined time, the defined number of times, and the defined number are arbitrarily set by an operator or the like. When monitoring multiple change events, countermeasure management section 82 manages the defined times for each of the multiple change events.

Here, it is possible that a mounting error detected after a defined time has elapsed due to other accidental factors or the like is higher than the possibility of such a mounting error occurring due to a change event. Therefore, when a mounting error occurs due to such a factor, it may not be appropriate to suspend production line 1 and perform maintenance from the viewpoint of maintaining the production efficiency. Therefore, when a mounting error is detected after a defined time has elapsed after the change event, countermeasure management section 82 causes the first error countermeasure to be executed in production line 1 regardless of statistical information M3. As a result, it is possible to prevent the suspending of production line 1 to cope with a mounting error caused by an accident or the like.

1-7. Management of Production Process by Production Management Device 80

Management of the production process by production management device 80 will be described with reference to FIGS. 6 and 7. Production management device 80 starts the management of the production process in accordance with the start of the production process of production line 1. When various data are received from a production device constituting production line 1, for example, information management section 81 updates statistical information M3 as shown in FIG. 7 (Step 11, hereinafter, "Step" is referred to as "S").

More specifically, information management section 81 receives, for example, a notification indicating the degree of progress of the mounting process and the detection of various change events from component mounter 5, and updates statistical information M3 in Tables 1 and 2 of FIG. 6. Further, information management section 81 updates statistical information M3 by receiving the inspection result from, for example, appearance inspection device 6, updating inspection data M2, and linking the inspection result with the mounting condition when the component that is an inspection target is mounted on board 90. With the update process (S11), items such as the amount of elapsed time from the change event and the number of mounting errors that have occurred are updated.

Next, countermeasure management section 82 determines whether a mounting error has been detected based on inspection data M2 (S12). When a mounting error has been detected (S12: Yes), countermeasure management section 82 determines whether there is a change event for which a defined time has not elapsed among the change events relating to all mounting conditions linked to the mounting errors (see Table 2 of FIG. 6)(S13).

For example, when a certain component is supplied to feeder 22, if the external shape data to be used is changed upon changing the supplier and a defined number of mountings have not been performed since the change of the external shape data, countermeasure management section 82 determines that the defined time has not elapsed (S13: Yes). On the other hand, when the defined time has elapsed since the change events for all of the product type, the board type, the component type, and the like which constitute the mounting condition of a certain component, it is determined that the defined time has elapsed (S13: No).

When a mounting error is detected before the defined time has elapsed from the change event in component mounter 5 (S13: Yes), countermeasure management section 82 compares the threshold value set in advance according to the mounting condition with the item corresponding to the mounting condition in statistical information M3 and updated based on the inspection result (S14). Specifically, as shown in the section of Table 1 of FIG. 6 demarcated by a dashed line, for example, a mounting error is detected in the mounting position (Ref1) of the component which is a mounting condition (S12: Yes), and the defined time has not elapsed since the replacement (change event) of feeder 22 supplying the component (S13: Yes).

In such cases, countermeasure management section 82 compares the thresholds (Th1, Th2, . . . ) for each item set in advance according to the mounting position of the component with respective items of statistical information M3 (i.e., the number of mounting errors (N31), the occurrence rate of mounting errors (R31), . . . ) (S14). When there is an item from statistical information M3 exceeding the threshold value for the item (S14: Yes), countermeasure management section 82 switches to the second error countermeasure (S15). As a result, production in production line 1 is suspended, and maintenance of component mounter 5 is enabled.

On the other hand, when there is no item from statistical information M3 exceeding the threshold value for the item (S14: No), or when it is determined in S13 that a defined time has elapsed (S13: No), countermeasure management section 82 switches to the first error countermeasure (S16). As a result, production is continued without suspending production line 1 and the processes on the downstream side of production line 1 from board 90 or unit board 91 in which a mounting error is detected are skipped.

Next, when countermeasure management section 82 switches between the first error countermeasure or the second error countermeasure, countermeasure management section 82 executes the third error countermeasure in accordance with settings of whether to notify the operator or the like (S17). Thus, for example, when the countermeasure is switched to the first error countermeasure (S16), the operator or the like is notified that production line 1 in which the mounting error has occurred is to be handled by skipping or the like without suspending production line 1 and production is to be continued (S17).

When the second error countermeasure is switched to (S15), the operator or the like is notified that maintenance on component mounter 5 is necessary (S17). At this time, in the above-described examples, component mounter 5, which mounted the component at the component mounting position (Ref1), is identified and a notification is sent out that component mounter 5 is a target for maintenance. Further, when it is surmised that there is a cause for maintenance in the control program or the suction nozzle, for example, based on an item of statistical information M3 exceeding a threshold value, such information may be added and sent out as a notification as well.

When a mounting error is not detected in the received inspection result (S12: No), information management section 81 determines whether each item of statistical information M3 is maintained within a suitable range (S18). For example, when it is determined by information management section 81 that the occurrence rate of the mounting error exceeds the threshold value or that the margin is reduced to less than the threshold value and that each item is not maintained within a suitable range (S18: No), countermeasure management section 82 switches the countermeasure to the third error countermeasure and causes the third error countermeasure to be executed (S17). As a result, the operator or the like is notified that maintenance will be required in the future together with the item of statistical information M3 which is showing signs of deterioration (S17).

Production management device 80 repeatedly executes the above-described process as appropriate during the execution of the production process of production line 1. As a result, when a mounting error is detected (S12: Yes), the countermeasure can be automatically switched between the first error countermeasure which continues production and the second error countermeasure which suspends production. When a mounting error is not detected (S12: No), the mounting state is obtained based on each item as a result of the analysis of statistical information M3, and the occurrence of mounting errors is prevented by properly performing maintenance.

2. Effects of the Embodiment Configuration

With production management device 80, the inspection results from appearance inspection device 6 are stored as statistical information M3 and linked to the corresponding mounting conditions. Such statistical information M3 is information that can be useful in the analyses for elucidating trends in execution state of error handling such as skipping on the downstream side of production line 1 and trends in mounting states when identifying the cause of a mounting error. As exemplified in the embodiment, when a mounting error is detected, the error countermeasure can be switched between multiple types of error countermeasures, or even if a mounting error is not detected, the necessity of performing maintenance can be determined based on the mounting state. As a result, it is possible to reduce production costs by reducing the number of discarded boards 90 while suppressing a decrease in production efficiency.

3. Modifications of the Embodiment

3-1. Statistical Information

In the embodiment, statistical information M3 is configured by linking multiple mounting conditions such as product type, board type, and component type to the inspection result. However, statistical information M3 may be configured by linking one mounting condition or other mounting conditions, aside from the mounting conditions illustrated in the embodiment, to the inspection result. Other mounting conditions may include component mounter 5 in the case where production line 1 is composed by multiple component mounters 5, the exchangeable elements used when components are mounted, and the like.

With such a configuration, for the inspection of a certain component, which component mounter 5 performed the mounting and which exchangeable element was used to perform the mounting are recorded in statistical information M3. When a mounting error is detected, for example, if it is recognized that the occurrence rate of a mounting error is high in mounting using a certain suction nozzle, it is presumed that a malfunction involving a pickup error is the cause of the mounting error. As described above, by increasing the number of mounting conditions, the cause of the mounting error is easily investigated and the time required for maintenance can be shortened.

In the embodiment, production management device 80 is configured to use statistical information M3 for a countermeasure when a mounting error is detected (e.g., switching among error countermeasures, identifying component mounter 5 having a cause for maintenance). In this manner, production management device 80 can be used in various measures for reducing production costs through the management of statistical information M3.

Specifically, production management device 80 can use statistical information M3 as a basis for judging whether the mounting state is properly maintained. Further, production management device 80 can use statistical information M3 as a basis for judging whether the configuration of production line 1 is appropriate and whether various commands (e.g., the moving speed of the mounting head) in the control program are appropriate. Production management device 80 can be used as a basis for judging whether an imaging command (e.g., imaging method, exposure time, etc.) is appropriate for part camera 41 or board camera 42.

3-2. Other

The embodiment demonstrates a mode in which the inspection device for acquiring an inspection result is appearance inspection device 6 which performs the appearance inspection. However, the inspection device may be other than appearance inspection device 6 as long as the component mounted on board 90 can be inspected by component mounter 5. Specifically, the inspection device may be component mounter 5 in which mounting head 33 is replaced with an inspection head having an inspection camera.

The inspection device may be functional tester 8 constituting production line 1. In this case, production management device 80 receives, as results of each function inspection by function inspection device 8, whether the function is functional or the level of functionality. Information management section 81 then links the mounting conditions to the results of multiple function inspections and stores them as statistical information. With such a configuration, although the level of the mounting state cannot be acquired as exemplified in the embodiment, it is possible to grasp the occurrence rate of the defect corresponding to the mounted component and use the statistical information as material for judging whether the mounting state is appropriate depending on the product type, the board type, and the component type.

In the embodiment, production management device 80 is illustrated as being incorporated in host PC 70. However, production-management device 80 may be an external device of host PC 70. For example, production management device 80 may be configured so as to be incorporated in the production device. Production management device 80 may be configured as a dedicated device communicably connected to component mounter 5 and host PC 70.

REFERENCE SIGNS LIST

1: Production line, 5: Component mounter, 6: Appearance inspection device, 8: Function inspection device, 20: Component supply device, 22: Feeder (replacement element), 30: Component transfer device, 33: Mounting head (replacement element), 34: Suction nozzle (replacement element), 70: Host computer (host PC), 80: Production management device, 81: Information management section, 82: Countermeasure management section, 90: Board (circuit board), 91: Unit board, M1: Control data, M2: Inspection data, M3: Statistical information

The invention claimed is:

1. A production management device, being applied to a production line configured to produce a board product, wherein the production line comprises a component mounter configured to mount a component on a circuit board under predetermined mounting conditions, and an inspection device, being located downstream from the component mounter, which is configured to inspect a mounting state of the component mounted on the circuit board, the production management device comprising:
a processor configured to:
store statistical information in which mounting conditions, at a time of mounting the component as an inspection target multiple times on the circuit board, are stored in association with respective results of multiple inspections by the inspection device; and
switch between multiple types of error countermeasures, which are executable in the production line, to handle a mounting error including:
when the mounting error is detected before a defined time has elapsed from a change event in the component mounter including a change in a mounting condition, switching between the multiple types of error countermeasures or combining more than one of the multiple types of error countermeasures in the production line based on the statistical information, and
when the mounting error is detected after the defined time has elapsed, continuing production in the production line regardless of the statistical information.

2. The production management device of claim 1, wherein the mounting condition include at least one of a type of the board product, a type of the circuit board, a type of the component, a mounting position of the component on the circuit board, and a type of external shape data indicating an external shape of the component used as a criterion for judging appropriateness of the component.

3. The production management device of claim 1, wherein the inspections by the inspection device include determining whether there is the mounting error in which the mounting state does not satisfy a predetermined condition, and
wherein the processor is configured to store, as the statistical information, a number of consecutive mounting errors or an occurrence rate of the mounting error, which are linked to a same mounting condition.

4. The production management device of claim 1, wherein the inspections by the inspection device include determining whether there is the mounting error in which the mounting state does not satisfy a predetermined condition.

5. The production management device of claim 1, wherein the multiple types of error countermeasures includes:
a first error countermeasure configured to continue the production in the production line while skipping production of a part of the board product that the mounting error has affected downstream from the inspection device;
a second error countermeasure configured to suspend production in the production line and make it possible to perform maintenance on the component mounter; and
a third error countermeasure configured to send out a notification that maintenance of the component mounter is required.

6. The production management device according to claim 4, wherein when the mounting error is detected before the defined time has elapsed, the processor is configured to switch between the multiple types of error countermeasures or combine the more than one of the multiple types of error countermeasures in the production line based on a threshold value set in advance according to a mounting condition and the statistical information.

7. The production management device of claim 6, wherein, when the mounting error is detected after the defined time has elapsed, the processor is configured to execute an error countermeasure for skipping production of a part of the board product that the mounting error has affected downstream from the inspection device in the production line.

8. The production management device of claim 1, wherein the change event includes exchanging an exchangeable element constituting the component mounter.

9. The production management device of claim 8, wherein the defined time is a time from the exchanging of the exchangeable element to a use of the exchangeable element for only a defined number of times in mounting the component.

10. The production management device of claim 1, wherein the change event includes a change in control data used for controlling the mounting of the component, and
wherein the control data includes a control program indicating a mounting position of the component on the circuit board, and external shape data indicating an external shape of the component used as a criterion for judging whether the component is appropriate.

11. The production management device of claim 1, wherein the inspections by the inspection device includes acquiring an amount of deviation of the mounting state of the component mounted on the circuit board from an ideal state, including an ideal mounting position and orientation.

* * * * *